INVENTOR
ALEXANDER PETER TREU
Cumphey & Erickson
AGENT

DISTORTION REDUCING CIRCUIT

Filed Nov. 9, 1964 5 Sheets-Sheet 2

INVENTOR
ALEXANDER PETER TREU
Cumpkey & Erickson
AGENT

INVENTOR
ALEXANDER PETER TREU
Curphey & Erickson
AGENT

INVENTOR
ALEXANDER PETER TREU
Curphey & Erickson
AGENT

Jan. 23, 1968 A. P. TREU 3,365,674

DISTORTION REDUCING CIRCUIT

Filed Nov. 9, 1964 5 Sheets-Sheet 5

INVENTOR
ALEXANDER PETER TREU
Curphey & Erickson
AGENT

United States Patent Office 3,365,674

Patented Jan. 23, 1968

3,365,674

DISTORTION REDUCING CIRCUIT

Alexander Peter Treu, Ottawa, Ontario, Canada, assignor to Northern Electric Company Limited, Montreal, Quebec, Canada Filed Nov. 9, 1964, Ser. No. 409,631
16 Claims. (Cl. 330—149)

ABSTRACT OF THE DISCLOSURE

In this invention of a means for amplifying a signal in an extremely linear fashion while minimizing gain reduction due to feedback, a sample of the input signal to an amplifier stage is detected, and a sample of the output signal from the stage is detected; the two samples are subtracted. If the stage is perfectly linear, the difference will be zero. However, if there is any difference (which could be caused by non-linearity within the stage) such difference is remodulated within the amplifier tube such as to cancel the difference. A stage with high gain and very low distortion is thus achieved. The subtraction is made either within a pentrode tube between the control and suppressor grids, or externally therefrom.

This invention relates to a circuit for reducing distortion in amplifiers, and is particularly useful in amplifiers of modulated carrier frequency signals. This application is related to copending application No. 409,632 filed Nov. 9, 1964.

A perfect linear amplifier is one in which the result of amplification, for instance an output signal, is an exact amplified duplication of an input signal. In practice, this ideal can only be approached, since the output vs input characteristic, or transfer function, of the amplifier is never perfectly linear.

A designer of an amplifying circuit must often have regard for the non-linear portion of the transfer function of his circuit. This non-linearity gives rise to frequency components in the output signal which were not present in the input signal. This problem of non-linearity becomes very important in amplifiers of amplitude-modulated carrier signals which are to be transmitted. In this case, non-linearity causes the addition of undesirable frequency components to the sidebands of the carrier signal, causing a waste in power and spectrum space, and the reception of these undesirable frequencies in a receiver. The problem becomes especially acute in the single-sideband system amplifiers. In this field great efforts are often made to delete unnecessary frequencies, as well as to conserve power.

Until now, various techniques have been used to make the transfer characteristics of an amplifier more linear. For instance, amplifiers are sometimes used over a small portion of their transfer characteristics which allows the approach to, but does not completely achieve, linearity. In these cases, an excessive number of stages are required to produce the total required amplification. Other methods for reduction of distortion are described in Electronic Technology, January 1960, pp. 13–20; Electronics, August 1955, pp. 124–125; and in Proceedings of the IRE, December 1956, pp. 1760–1765. The methods described in the latter article are the use of negative feedback, modulation envelope-distortion cancellation, and a combination of the two.

As explained in the latter aforementioned article, the amount of feedback that can be safely used to reduce distortion depends on the phase-gain characteristics of the feedback loop. This introduces a distortion reduction limiting factor, since excessive phase change can cause instability. In addition, the use of feedback introduces an undesirable reduction of gain in the amplifier stages around which it is used.

The modulation envelope-distortion cancellation method description in that article shows that until now, distortion reduction was attempted over a number of stages in cascade. In an amplifier system comprising a number of stages, the modulation component, or envelope, of the input signal to the system was detected. This was applied to a differential amplifier along with the detected envelope of the output signal of the system. A signal corresponding to the difference between the two envelopes, the distortion components, was derived from the differential amplifier and applied to an audio or modulation amplifier which presented it in suitable form to an amplifier in the system for modulation of the signal traversing therethrough. Because of the multiplicity of tuned circuits and other reactive components in the system, the detected modulation component of the input signal did not exactly correspond in phase with the modulation component of the output signal. Therefore, when the difference between the signals was applied to the differential amplifier, a difference correction signal comprised not only of the distortion components, but also of the undesirable phase-difference components was produced, which generated additional distortion which remodulated the principal signal.

In addition, in the past a differential amplifier as well as an audio or modulation amplifier was required for the correction signal which in itself, due to its inherent non-linearity, imposed a phase difference between the correction signal and the component of the principal signal which was to be corrected; thus generating additional distortion components.

I have invented a method of cancellation of distortion within a single stage of amplification, which allows the use of the maximum amplification capacity of the stage. Due to the fact that the generation of the differential signal, and the modulation as well as the detection of the input and output signals is accomplished within a single stage, my invention does not cause the generation of an objectionable amount of distortion components due to phase differences of the samples of the output and input signals used to obtain the differential. Because there is no effective feedback except for the distortion component of the signal, there is effectively no gain reduction from the maximum capability of the stage. My invention also achieves a large reduction of circuit elements over the distortion cancellation method described in the aforementioned article.

My invention is a circuit for reducing distortion within a single amplifier stage comprising a single amplifier valve, a signal input circuit and a signal output circuit connected to the amplifier valve, subtracting means within said stage, a first detecting means connected to the signal input circuit for detecting a first sample of a modulation component of the input signal, a second detecting means connected to the signal output circuit for detecting a second sample of the modulation component of the output signal, and applying it to the subtracting means; the amplitude of said second sample being such that its effect in the subtracting means is substantially equal to the effect of the sample of the input signal in the absence of distortion which may be caused by a non-linear circuit element which may be connected in the signal path between the signal input circuit and the signal output circuit, and modulating means within the amplifier valve for modulating a signal traversing the valve from said input circuit to said output circuit, with the difference between the effects of said samples in such manner as to decrease non-linear distortion of the input signal. Thus, if no distortion is present, the effects of the two samples will be virtually identical and will virtually cancel. However, if the effect of one sample should differ from the effect of the other due to the introduction of distortion within the stage, the difference, or distortion component, between the effects of the two samples modulates the input signal within the valve so as to provide a virtually distortionless output signal.

Another arrangement of this invention is shown in copending application No. 409,632 filed Nov. 9, 1964.

In order to better understand my invention, reference should be made to the drawings as follows.

Figure 1:
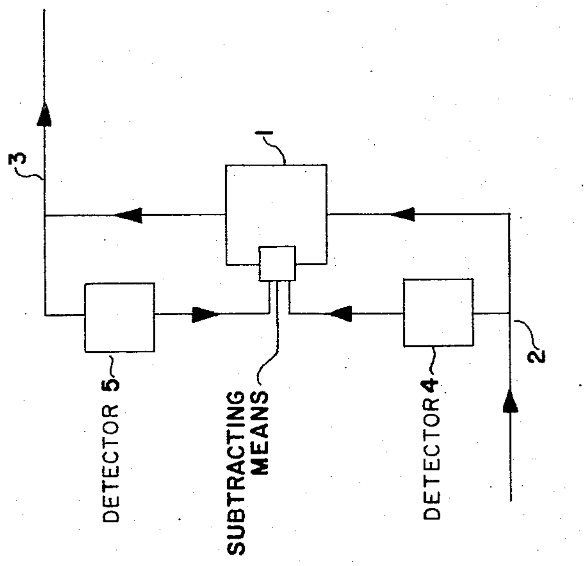
FIG. 1 is a block diagram representation of the basic essence of the invention.

FIG. 1 is a block diagram of a single amplifier stage comprising amplifier valve 1, signal input circuit 2, and signal output circuit 3. A first detecting means 4 connected between the signal input circuit and the amplifier valve, is provided to detect a first sample of the modulation component of the input signal, and a second detecting means 5 connected between the signal output circuit 3 and the amplifier valve 1 is provided to detect a second sample of the modulation component of the output signal. Subtraction of the two samples takes place within the subtracting means in the stage, and the difference between the two signals is used to modulate the input signal within the single valve 1.

Provided the circuit elements between the points where the sample of the input signal and the sample of the output signal are detected have perfectly linear transfer functions, the output signal from the stage will be a replica of the input signal. It may be seen that if this is true, no difference between the samples exists, and hence no modulation will occur. The amplifier valve may be used to its maximum capabilities with no decrease in gain caused by feedback of either of the detected samples, since they mutually cancel.

However, let us suppose that there is a non-linear circuit element present between the two aforementioned detection points. In this case, the output signal will not be an exact replica of the input signal and a Fourier analysis of the output signal will reveal frequency components which are not present in the input signal. Therefore, the difference between the detected samples (being the undesirable generated frequencies) will, in my invention, modulate the signal traversing the single amplifier valve so as to cancel the undesirable generated extraneous frequencies within the single amplifier stage. Therefore, the output signal wil be virtually an exact replica of the input signal.

One useful embodiment of my invention comprises an amplifier valve having a source electrode for charge carriers, a collecting electrode for charge carriers and two control electrodes for charge carriers. For instance, the amplifier valve can be an electron tube having a cathode, an anode, and two grids. The component extracted from the input signal can be applied to one grid and the component of the output signal which has been extracted can be applied to the other grid. Although various combinations of control, screen, or suppressor grids may be used within the scope of my invention, I prefer to use the control and suppressor grids of a pentode electron tube as the two control electrodes. Thus, one of the components is applied to the control grid and the other of the components to the suppressor grid.

Figure 2:
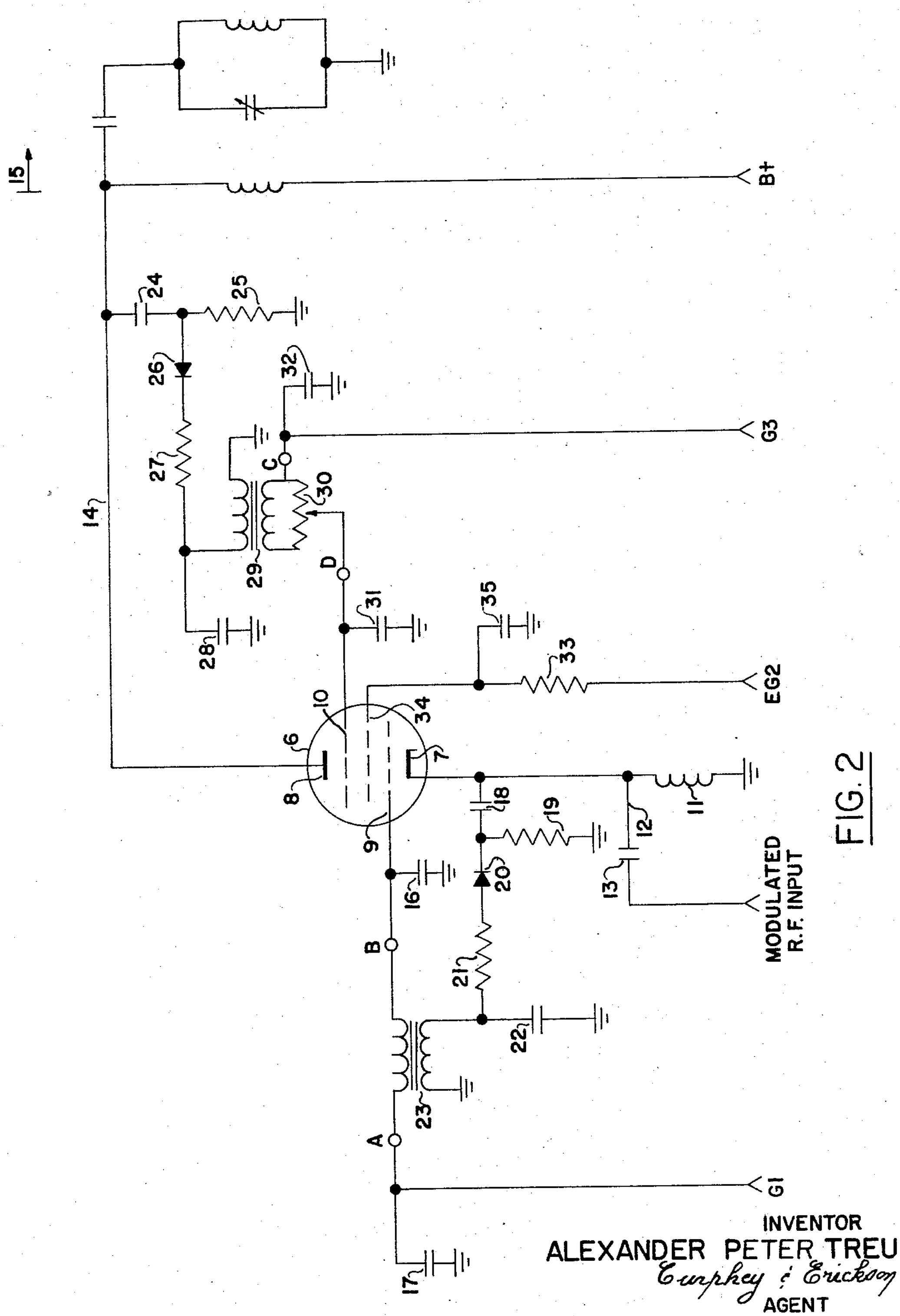
FIG. 2 is a schematic diagram of one embodiment of the invention.

An extremely useful application of my invention is in an amplifier stage used for a modulated radio frequency carrier signal, where extreme linearity of amplification is desired. An amplifier for this use is shown in FIG. 2. In this particular case, extreme linearity of the envelope or modulation waveform is important, since if used in a single sideband transmitter, the carrier frequency and one sideband of frequencies will be eliminated prior to transmission. Any undesirable frequency components caused by non-linear operation of the amplifier will generate power-wasting, bandwidth-consuming, and distorting inband products as well as superfluous sidebands.

Shown in FIG. 2 is electron tube 6 having cathode 7, anode 8, control grid 9 and suppressor grid 10. I have chosen to connect the amplifier in grounded control grid configuration, but it will become obvious to one skilled in the art understanding my invention that a circuit could be designed for grounded cathode configuration amplifier operation. In my circuit, I have shown a signal input circuit comprising isolation inductor 11 and conductor 12 connected to cathode 7. The return conductor for the signal input circuit may be, of course, common signal ground, and is not shown. I have shown capacitor 13 in the signal input circuit for direct current isolation purposes from the previous stage. However, other signal input circuits may be used within the scope of my invention.

A signal output circuit comprising conductor 14 and circuit elements to the right of numeral 15 on the drawing is connected to anode 8. Other output circuits may, of course, be used within the scope of this invention. The control grid 9 is effectively connected to ground for carrier signal frequencies by means of bypass capacitor 16, and for modulating signal frequencies by means of the return lead, not shown, of negative bias voltage source G1 provided for grid 9 and by capacitor 17. It may be seen that the so far described circuit stage would amplify in the normal grounded grid configuration manner.

According to this embodiment of my invention, I provide a first detecting means for detecting a first sample of the modulation component of the input signal which appears in the signal input circuit. In this case, the first detecting means comprises a half-wave detector for the modulation component of the input signal. For the detector, I have used the combination of elements comprising direct current blocking capacitor 18, connected to the signal input circuit at conductor 12, in series with resistor 19 to ground. A rectifier 20 is connected with one electrode to the junction of capacitor 18 and resistor 19, and the other in series with resistor 21 and then capacitor 22 to ground. Resistor 21 and capacitor 22 comprise a filter which acts in a well known manner to bypass as much of the carrier frequency signal which has traversed the detector as possible. Therefore, if one was to measure the signal appearing across capacitor 22, one would observe the modulation component of the signal appearing in the signal input circuit.

In this embodiment, the primary winding of a first transformer 23 is connected across capacitor 22. The secondary winding of transformer 23 is connected in series with the conductor leading from control grid 9 of the electron tube 6 to its source of negative bias potential G1 as shown in FIG. 2. Thus it may be seen that since the negative bias potential is connected in series with the secondary winding of transformer 23, the detected modulation signal appearing in the primary and therefore also the secondary will cause the effective bias potential on grid 9 of electron tube 6 to vary in accordance with this signal.

In order to detect the modulation component of the output signal, or second sample, I have provided a detector connected to the signal output circuit similar in all respects to the detector connected to the signal input circuit. This detector comprises capacitor 24, resistor 25, diode 26, resistor 27, and capacitor 28 connected in the same configuration as the components of the detector connected to the signal input circuit, except that the terminal conductor of capacitor 24 which is not connected to diode 26 is connected to the conductor 14 of the signal output circuit 15.

The primary of a second transformer 29 is connected across capacitor 28, thus allowing a signal corresponding to the modulation component of the output signal appearing in the output circuit to appear across its primary and secondary windings. This signal is applied via the secondary winding between the suppressor grid and its source of negative bias or signal ground. However, it will be realized that because of the amplification of the tube, although the output signal will be a replica of the input signal, it will be greatly enlarged in magnitude. For this reason, I employ a variably-tapped resistor connected across the secondary of transformer 29 in order to select a proportion of said second sample and apply it to the suppressor grid. The proportion selected and applied to the suppressor grid balances and thus cancels the effect of the signal applied to the control grid. Capacitor 31 connected between suppressor grid and ground is provided to bypass any carrier frequency signals which may have traversed the detector to the suppressor grid. Capacitor 32, connected between the point where the source of negative bias G3 is connected to the transformer 29, and ground, is provided also for this reason as well as to ensure that this point is at ground potential with respect to alternating currents of modulation component frequency. It may be seen that there is a direct current path from the negative bias source G3, through the secondary of second transformer 29, through variably tapped resistor 30, to suppressor grid 10. Signals appearing at the secondary of transformer 29 modify the bias which is applied to suppressor grid 10.

Thus, it may be seen that in the absence of distortion, the sample signals appearing between control grid 9 and ground and suppressor grid 10 and ground may be made virtually equal in effect. The polarities of the windings on transformers 23 and 29, and diodes 20 and 26 are arranged so that the signals appearing between the respective grids and ground are opposite in polarity, i.e., effectively 180 degrees out of phase. Thus, the influence a signal appearing on control grid 9 has on the flow of charge carriers from the cathode 7 to anode 8 of electrode tube 6 is cancelled by the signal appearing at suppressor grid 10. In this case of grounded grid configuration, the signal applied to the control grid should be in phase with its component of the input signal in the signal input circuit connected to the cathode.

However, if electron tube 6, because of its non-linearity, introduces distortion components which appear in the signal output circuit, the distortion products related to the modulation signal will appear at the suppressor grid 10 in said second sample along with the cancellation signal. Because these additional components will not be cancelled, they will remodulate the flow of charge carriers within the electron tube in such manner as to cancel the generated distortion components of the modulation signal. Thus it may be seen that the modulation component of the output signal substantially free of any distortion generated by the electron tube will be reproduced in the signal output circuit. In this regard, it may be seen that any distortion-causing non-linear element connected between the point where the first sample in the signal input circuit is detected and the point where the second sample in the signal output circuit is detected will cause a difference in the signals appearing at control grid 9 and suppressor grid 10. Therefore, distortion caused by circuit elements other than the electron tube itself can be corrected for.

The signal appearing at the control grid and the signal appearing at the suppressor grid effectively 180 degrees out of phase can cause a space charge to be built up therebetween. The screen grid in a pentode, due to its normally applied positive potential, can tend to assume the function of an anode. High modulation peaks may therefore result in excessive screen current, which, in turn would cause high third order distortion. Therefore, it may be desirable to employ a separate screen grid direct current supply. This has been shown in FIG. 2 as EG2 connected through resistor 33 to screen grid 34 of electron tube 6. Bypass capacitor 35 is provided to bypass alternating currents appearing at the screen grid to ground. Excessive screen current now will cause a voltage drop across the series resistor 33 and thus a decrease in the potential appearing at the screen 34. This would also cause a decrease in gain of the amplifier during the high modulation peaks, which is desirable if maximum linearity for all modulation levels is to be maintained.

Figure 3:
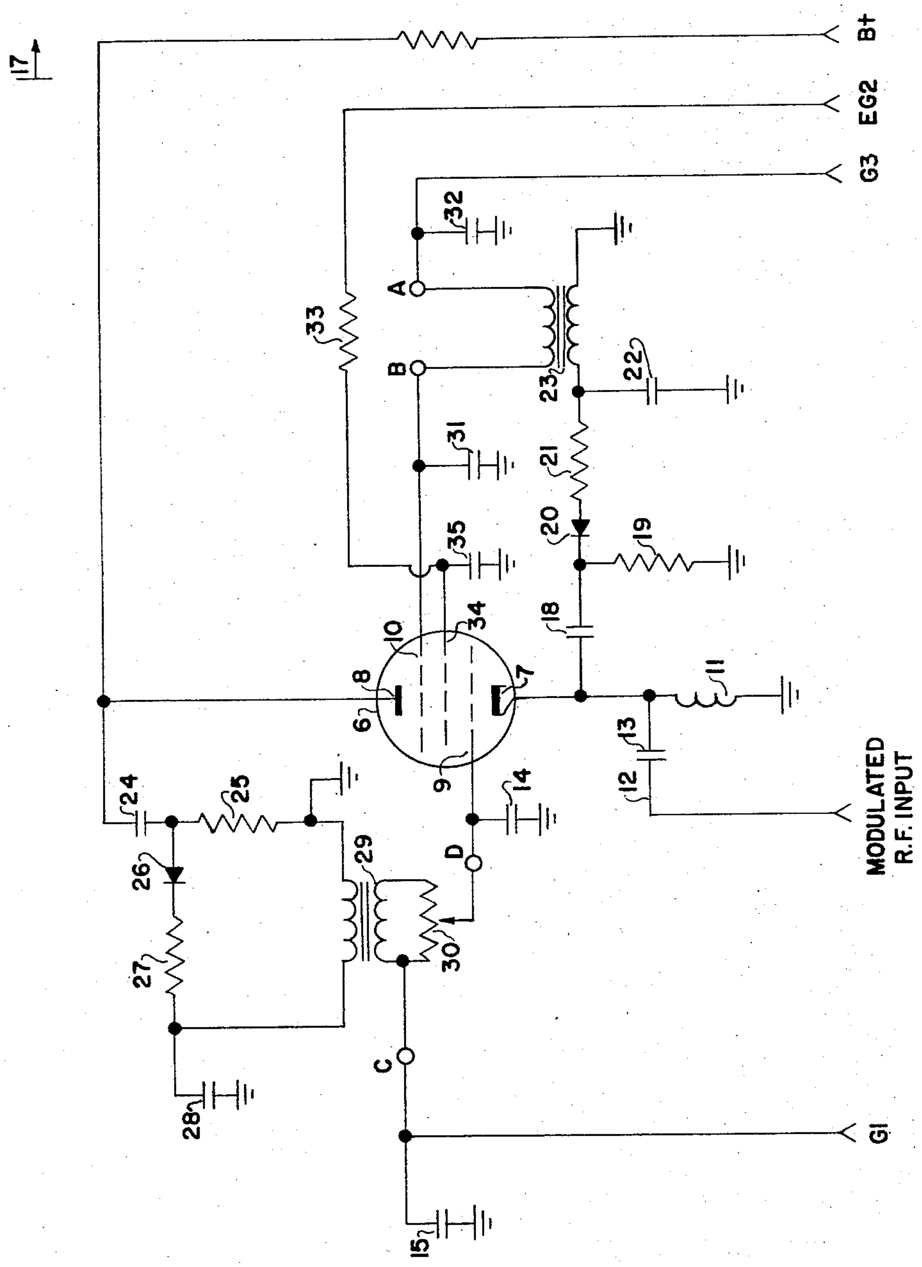
FIG. 3 is a schematic diagram of another embodiment of the invention.

With a pentode electron tube, to which the above embodiment is directed, both the control grid and the suppressor grid may be used for modulation of the charge carrier flow. Suppressor grid modulation is similar in many respects to control grid modulation, and the anode efficiency is about the same for both types of modulation. This fact makes the embodiment shown in schematic form in FIG. 3 possible. In this case, the modulation component of the input signal which is detected is applied to the suppressor grid rather than to the control grid, and the detected modulation component of the output signal is fed to the control grid rather than the suppressor grid. In this case the signal applied to the suppressor grid is in phase with the modulation component appearing in the signal input circuit. Thus the differential signal appearing between suppressor grid and control grid has negative sense towards the control grid with respect to the suppressor grid. Otherwise, the theory of operation is identical with that of the embodiment shown in FIG. 2. The given designation of the elements is identical with that of FIG. 2 but it will be seen that the points A and B at the detector connected to the signal input circuit in FIG. 2 are interchanged with the points C and D at the detector connected to the signal output circuit. Thus, point A of the signal input circuit detector is interchanged with point C of the signal output circuit detector, and point B of the detector connected to the signal input circuit is interchanged with point D of the detector connected to the signal output circuit. This interchange is shown in FIG. 3. An evaluation of pentodes with very high transconductances has revealed that this embodiment will give better distortion cancellation results than the embodiment shown in FIG. 2 since there is less danger of overloading the screen grid, and therefore this is my preferred embodiment.

Due to their relative positions within the tube, and inherent characteristics, the control and suppressor grids have different powers of modulation from each other upon a charge stream traversing the tube. Therefore, the respective signals applied thereto must have different amplitudes in order to achieve mutual cancellation. The grid signals must be the ratio $$\frac{e_2}{e_1}=\frac{\frac{\Delta I_p}{e_{g1}}}{\frac{\Delta I_p}{e_{g2}}}=\frac{gm\ (\text{grid } 1)}{gm\ (\text{grid } 2)}$$

where $e_2$ is the signal to be applied to the suppressor grid, $e_1$ is the signal to be applied to the control grid, $\Delta I_p/e_{grid\ 1}$ is the change in plate current with respect to a change in signal applied to the control grid, $\Delta I_p/e_{grid\ 2}$ is the change in plate current with respect to a change in signal applied to the suppressor grid, $gm$ (grid 1) is the control grid to plate transconductance, and

*gm* (grid 2) is the suppressor grid to plate transconductance.

Thus it may be seen that the ratio of the signals applied to the suppressor and control grids varies according to the inverse ratios of their transconductances.

I have tested and compared my invention with a similar amplifier not containing my invention. In an amplifier which was capable of delivering 8 watts peak power and having odd order distortion products 50 db lower than the output power, the gain was measured to be 14 db. The anode efficiency was 16%. In the same amplifier using my invention, keeping the distortion products no greater than 50 db lower than the output power, the peak power was measured to be almost double, 15 watts, resulting in an anode efficiency of 41.6%. The gain in this case was 15.3 db, showing that there was no decrease in gain, but a modest increase. Removing the elements of my invention from the amplifier, the distortion products were measured at 36 db lower than the output power; therefore my invention resulted in a 14 db improvement in distortion reduction. All these benefits were obtained within a single stage of amplification, with a minimum of components, and with no decrease in gain as is found in feed-back distortion reduction circuits.

Figure 4:
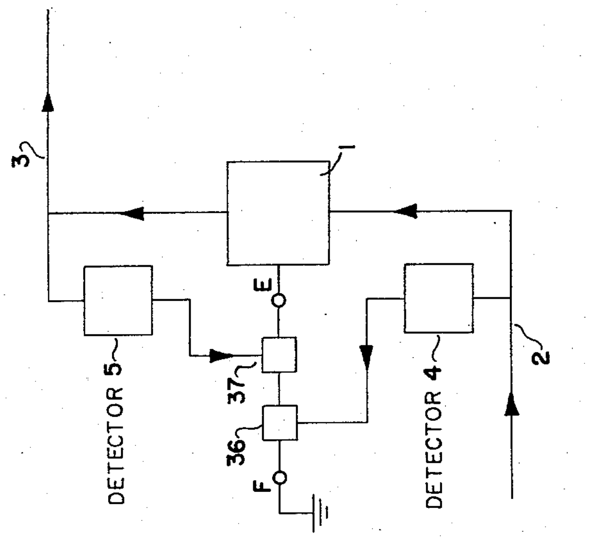
FIG. 4 is a block diagram representation of another method of effecting the inventive idea further defined in the aforementioned copending patent application, and may be found on the same sheet of drawings as FIG. 1.

A method of applying the broad idea of this invention to an amplifier stage wherein the active element is a three electrode valve, having a source electrode, a collecting electrode, and a single control electrode for charge carriers may be found in copending patent application Ser. No. 409,632 filed Nov. 9, 1964 and is described below. In this case, the difference signal can be generated using passive elements outside the valve, applied to the control electrode, and have the distortion correcting modulation effected within the valve. In this regard. FIG. 4 shows a block schematic form of one embodiment thereof. It comprises an amplifier valve 1, a signal input circuit 2 and a signal output circuit 3 connected to the amplifier valve 1, first detection means for detecting a first sample of the modulation component of the input signal 4 connected to the signal input circuit, and second detection means for detecting a second sample of the modulation component of the output signal 5 connected to the signal output circuit. Means 36 is provided for reproducing the detected component of the input signal and means 37 is provided for reproducing the detected component of the output signal, connected in such fashion that the difference between the two signals appears between points E and F. This difference may be used to modulate the charge carriers flowing within the amplifier valve 1 between the signal input circuit 2 and signal output circuit 3, by being applied to the control electrode of the three electrode valve.

Figure 5:
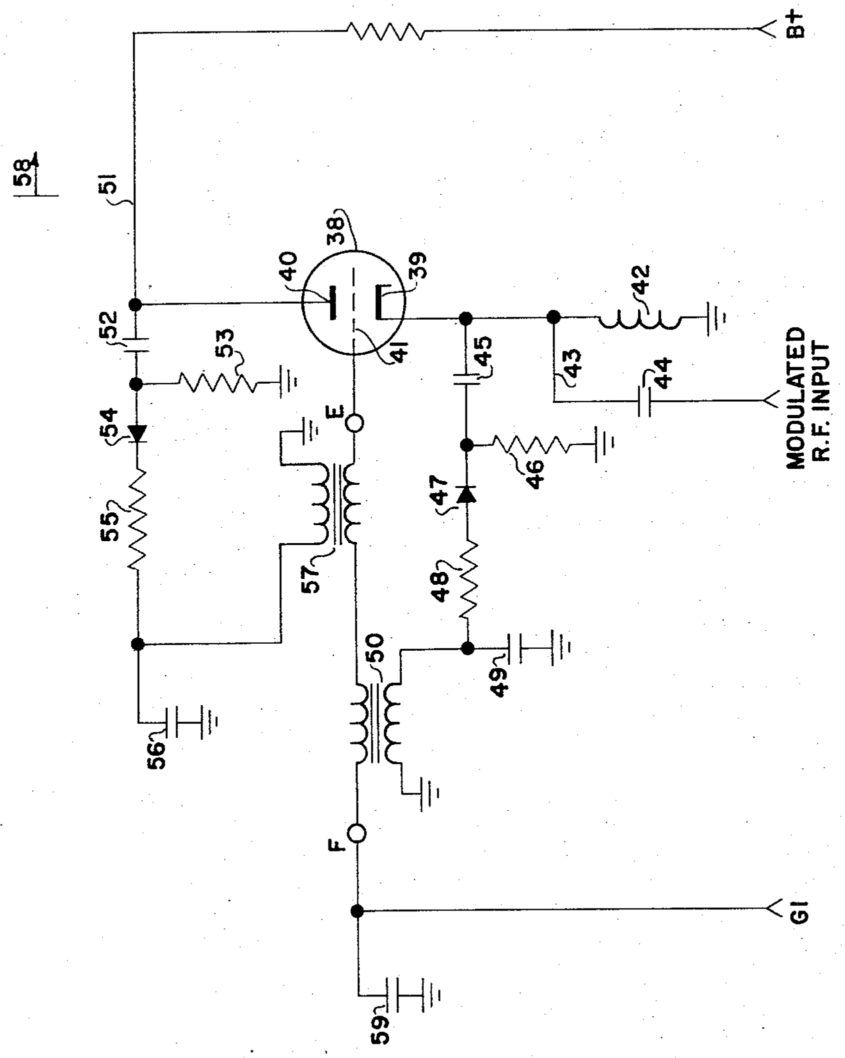
FIG. 5 is a schematic diagram of another embodiment of this invention, according to the block diagram of FIG. 4.

FIG. 5 shows a complete schematic diagram of a three electrode valve used in an amplifier employing that invention. Again, for ease of description, an electron tube amplifier stage is shown in grounded grid configuration. The principle described below, of course, can be applied by one understanding the invention to the semiconductor art, and the triode valve comprise a transistor, and either valve may have a grounded cathode or equivalent configuration.

FIG. 5 shows a triode tube 38 having cathode 39, anode 40, and control grid 41. As in FIG. 2, a signal input circuit is provided comprising cathode isolation inductor 42 and conductor 43. The input signal comprises, in this case, a modulated carrier signal and is applied via blocking capacitor 44 and common signal ground to the signal input circuit. First detection means for detecting a first sample of the modulation component of the input signal is provided with similar construction to that in FIG. 2, for instance, comprising capacitor 45, resistor 46, diode 47, resistor 48, and capacitor 49. Of course, other detectors and means for detecting a sample of the modulation component of the input signal may be used. The primary of transformer 50 is connected across capacitor 49, as in the embodiment shown in FIG. 2.

A signal output circuit comprising conductor 51 is connected to anode 40 of electron tube 38. Second detection means for detecting a second sample of the modulation component of the output signal similar to the one used in the embodiment shown in FIG. 2 is connected to conductor 51. This, of course, can also have a design other than the particular one shown provided it operates in a similar manner to the means for detecting the sample of the input signal. The design shown in FIG. 5 comprises capacitor 52, resistor 53, diode 54, resistor 55, and capacitor 56 connected similar to the means for extracting a sample of the input signal. The primary of transformer 57 is connected across capacitor 56 to receive the detected signal.

In this embodiment, the secondary windings of transformers 50 and 57 are the means for reproducing the samples of the input and output signals respectively and are connected in series between control grid 41 of the electron tube 38 and its source of negative bias G1. The source of negative bias is effectively at ground potential with respect to alternating potentials due to bypass capacitor 59. The transformers are connected in a manner and have such winding turns ratios that the signals appearing across the secondary windings mutually cancel with respect to points E and F. Of course other means, such as a variably-tapped resistor, could be used to render the samples equal in amplitude. Therefore, if a signal is present in the detected component of the output signal which is not present in the detected component of the input signal, a difference signal will appear between grid 41 and common signal ground. This difference signal will modulate the flow of charge carriers from the cathode to the anode within electron tube 38. Any distortion products which may be generated between the points at which the first sample and the second sample are detected are effectively reduced to negligibility. Thus the output signal appearing in the signal output circuit and in the load circuit elements which appear to the right of numeral 58 in FIG. 5 will be a faithful reproduction of the input signal.

It will be seen that the secondaries of transformer 50 and 57 are connected in series so that a signal corresponding to the difference between the two appearing across each secondary will appear between control grid 41 and ground, or points E and F. However, other methods of generating the difference signal outside the valve may be used within the scope of this invention.

Figure 6:
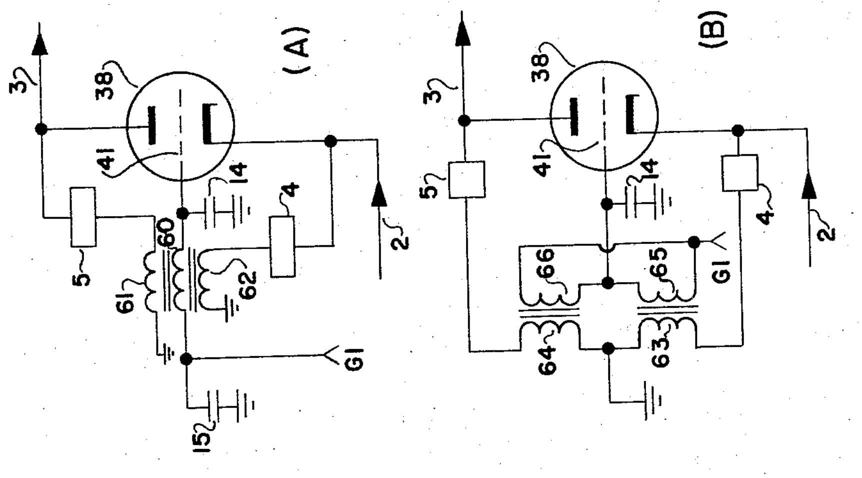
FIG. 6 shows schematically two means to achieve the difference between the two sample signals of the invention defined in the aforementioned copending patent application.

For instance, two signal subtraction configurations of transformers are shown in FIGS. 6*a* and 6*b*. The transformer shown in FIG. 6*a* comprises primary winding 60, secondary winding 61, and tertiary winding 62. Means for detecting a first sample of the modulation component of the input signal 4 provides the first sample across winding 62, and means for detecting a second sample of the modulation component of the output signal 5 provides the second sample across winding 61. The two signals pass through their respective windings in such a direction as to mutually cancel. Should the signal traversing winding 61 be different from the signal traversing winding 62, the difference between the two will be induced in winding 60, through which the bias for control grid 41 of electron tube 38 is passing. In the same manner as described above, this signal modulates the flow of charge carriers within electron tube 38 in such direction as to cancel the component which forms the difference between the two samples.

FIG. 6*b* shows another method of producing the difference signal using two transformers. The signal produced by the first detection means 4 is applied across the primary 63 of the first transformer, and the signal produced by the second detection means 5 is applied across the primary 64 of the second transformer. Bias for the control electrode 41 of electron tube 38 is applied through the secondaries 65 and 66 of the first and second transformers respectively which are connected in parallel. Thus an alternating potential appearing across the primary of transformer 65 which is identical but opposite in phase with a signal appearing across the primary winding 66 will mutually cancel, and the bias potential $G_1$ will be applied to the grid 41 unimpeded. However, if a difference between the two aforementioned signals is present, this difference signal will modify the bias and modulate the charge carriers traversing electron tube 38 in the method described above. Thus, it may be seen that various means of passive subtraction of the two detected signals may be designed within the scope of this invention.

Figure 7:
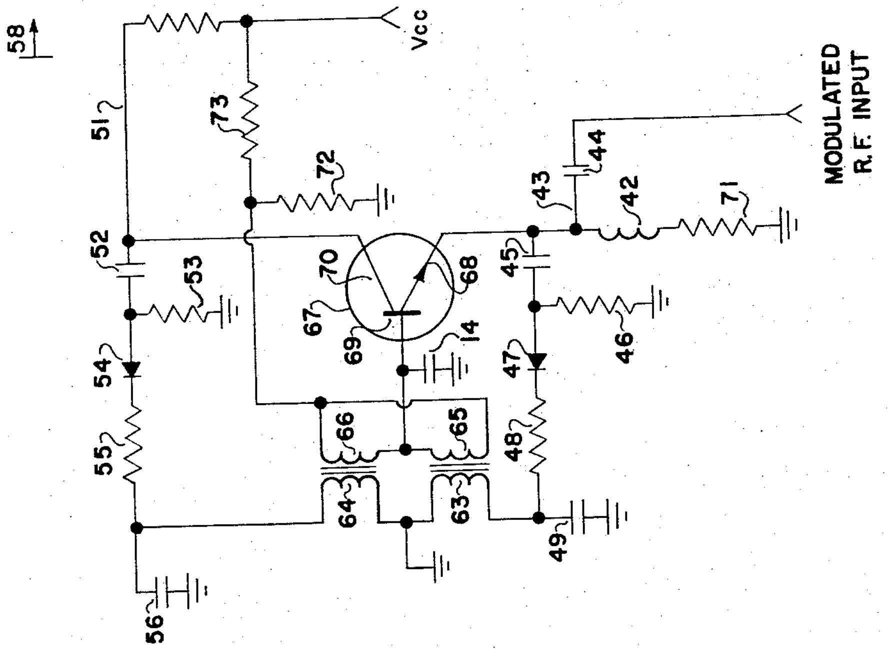
FIG. 7 is a schematic diagram of another embodiment of the invention in the aforementioned copending patent application.

As was mentioned above, the fact that this invention may be applied to a valve comprising one control electrode makes it applicable to transistor amplifiers. In this regard, shown is an embodiment of this invention in FIG. 7 with a transistor connected in the grounded base configuration. For this description, the method shown of subtraction of the sample of the output signal and the sample of the input signal is as in FIG. 6*b*. However, the biasing networks for the transistor circuit shown in FIG. 7 will be slightly different from FIG. 6*b* because the valve in this case is a transistor.

Shown is transistor 67 having emitter 68, base 69, and collector 70. As in the embodiment of FIG. 5, a signal input circuit comprising conductor 43 and emitter isolation inductor 42 is connected to emitter 68. Bias resistor 71 is connected between the other end of inductor 42 and ground. A signal output circuit comprising conductor 51 and load 58 is connected to collector 70. As described previously and connected in similar form, first detection means for detecting a first sample of the modulation component of the input signal comprising capacitor 45, resistor 46, diode 47, resistor 48, and capacitor 49 is connected between the signal input circuit and the primary 63 of the first transformer. Also as described above, second detection means for extracting a second sample of the modulation component of the output signal comprising capacitor 52, resistor 53, diode 54, resistor 55, and capacitor 56 is connected between the signal output circuit and the primary 64 of the second transformer. Secondary windings 65 and 66 are connected in parallel configuration so that the signals appearing thereacross are opposing, with one end of the pair connected to the base 69 of transistor 67 and the other end to resistor network 72 and 72 which supply the proper bias potential for transistor base 69 from a source of potential $V_{cc}$. Thus, it may be seen that the alternating current function of this transistor circuit is analogous to that of the electron tube circuit of FIG. 5. Indeed, it may be seen that any amplifier valve achieving the same functions as those described above may be used.

In the present state of the art, circuits involving reactive components, such as the transformers used in various embodiments, impose frequency bandwidth limitations on a signal traversing therethrough. In this regard, transformers efficient in passing of say, audio frequency, are inefficient at radio frequencies. Since an audio frequency is likely to be the modulation component of the radio frequency carrier signal, and since it is the audio frequency modulation component which is reproduced in a receiver, this is the most important component of the signal to be amplified, as it carries the intelligence. Therefore, in the embodiments shown for the concentration of the correction to the modulation component, the transformers used will be those designed most efficiently for modulation frequency signals. However, if the input signal comprises only single frequencies, the transformers can be designed to transmit any distortion frequency band of interest. In addition, those understanding this invention and having a specific requirement for its application can design other passive subtraction networks than the transformer configurations shown, other means for extracting samples of the modulation component of the input and output signals, and other circuit configurations of the amplifier valve within the scope of my invention.

It will be seen by one understanding my invention that I have been able to accomplish effective distortion cancellation due to the absence of complicated circuitry which causes phase differences between the sample of the input signal and the sample of the output signal, and because the complete cancellation, modulation, and amplification function is performed within a single stage. I have provided a circuit for reducing distortion within a single amplifier stage having a greatly reduced number of elements from the prior art, thus achieving an improvement in economy. In addition, because of my improved distortion reduction factor, less amplifier power is wasted, since distortion signal components are greatly reduced, and greater economy of bandwidth is achieved.

What is claimed is:

1. A circuit for reducing distortion within a single amplifier stage comprising:

(a) an amplifier valve, (b) a signal input circuit to which an input signal may be connected, and a signal output circuit from which an output signal may be received, connected to the amplifier valve, (c) subtracting means within said single stage, (d) a first detecting means connected to the signal input circuit and the subtracting means for detecting a first sample of a modultion component of the input signal and applying it to the subtracting means, (e) a second detecting means connected to the signal output circuit and the subtracting means for detecting a sample of the modulation component of the output signal, and applying it to the subtracting means; the amplitude of said second sample being of such amplitude that its effect in the subtracting means is substantially equal to the effect of the sample of the input signal in the subtracting means in the absence of distortion which may be caused by non-linearity within a circuit element which may be connected in the signal path between the signal input circuit and the signal output circuit, and not equal to the effect of the sample of the input signal in the subtracting means in the presence of distortion caused by said non-linearity, and (f) modulating means within the amplifier valve for modulating a signal, traversing the valve from the input circuit to the output circuit, with any difference between the effects of said samples in such manner as to reduce distortion of the input signal.

2. A circuit for reducing distortion within an amplifier stage as defined in claim 1 wherein the circuit element causing distortion is the amplifier valve.

3. A circuit for reducing distortion as defined in claim 1 wherein the amplifier valve comprises the subtracting means.

4. A circuit for reducing distortion as defined in claim 3 wherein the single amplifier valve comprises a charge-carrier source electrode, a charge-carrier collecting electrode, and two charge-carrier control electrodes, wherein said detected first sample is applied to one of said control electrodes, and said detected second sample is applied to the other of said control electrodes effectively 180 degrees out of phase with said sample applied to said first control electrode; said subtracting means comprising said two control electrodes.

5. A circuit for reducing distortion as defined in claim 4 wherein said amplifier valve is an electron tube, said source electrode is a cathode, said collecting electrode is an anode, and said control electrodes are a control grid and a suppressor grid contained therein.

6. A circuit for reducing distortion as defined in claim 5 wherein said first sample is applied to the control grid, and said second sample is applied to the suppressor grid.

7. A circuit for reducing distortion as defined in claim 5 wherein said first sample is applied to the suppressor grid, and said second sample is applied to the control grid.

8. A circuit for reducing distortion as defined in claim 1 wherein the signal applied to the signal input circuit is an amplitude modulated carrier signal, and the first and second detecting means are each means for detecting said samples of the modulation components of the carrier signals in the signal input and signal output circuits respectively.

9. A circuit for reducing distortion as defined in claim 5 wherein the signal in the signal input circuit comprises an amplitude modulated carrier signal, the first detecting means comprises means for detecting said first samples, connected so as to apply said first sample to the suppressor grid, the second detecting means comprising means for detecting said second sample, reducing its amplitude, and applying it to the control grid effectively 180 degrees out of phase with said first sample; its amplitude being such that its effect upon the charge carriers is substantially opposite and cancelling to the effect of the sample of the input signal in the absence of distortion; said two samples applied to said grids coacting upon the charge-carriers traversing the electron tube in such manner as to modulate it with any difference between the instantaneous effective amplitudes of said samples so as to substantially decrease said difference.

10. A circuit for reducing distortion as defined in claim 5 wherein the electron tube is connected in grounded grid configuration, and wherein the sample of the detected modulation component of the input signal is applied to one control electrode effectively in phase with said component in the signal input circuit.

11. A circuit for reducing distortion as defined in claim 6 wherein:

(a) the signal input circuit comprises signal isolation means connected between the cathode and ground, and adapted to allow direct current to flow therebetween while presenting a high impedance to an input signal, (b) the means for detecting said first sample comprises half wave modulation component detection means connected to said signal input circuit and adapted to allow said first sample of the modulation component of the input signal to traverse therethrough, (c) means are connected to the control grid for applying said first sample of the modulation component to the control grid in phase with the corresponding portion of the modulation component in the signal input circuit so as to modify a bias potential which may be connected to the control grid, (d) the signal output circuit comprises an output signal load connected to the anode of the electron tube, (e) the means for detecting said second sample comprises half wave modulation component detection means connected to the output load and adapted to allow said second sample of the modulation component of the output signal to traverse therethrough, (f) means are connected to said second detection means for applying a portion of said second sample of the modulation component of the output signal of amplitude substantially equal in effect to the sample of the modulation component of the input signal within the subtracting means, in the absence of distortion, to the suppressor grid, but effectively 180 degrees out of phase with said first sample which is applied to the control grid, so as to modify a bias potential which may be connected to the suppressor grid.

12. A circuit for reducing distortion as defined in claim 7 wherein:

(a) the signal input circuit comprises signal isolation means for the input signal connected between cathode and ground and adapted to allow direct current to flow therebetween while presenting a high impedance to an input signal, (b) the means for detecting said first sample comprises half wave modulation component detecting means connected to said signal input circuit and adapted to allow said first sample of the modulation component of the input signal to traverse therethrough, (c) means are connected to the suppressor grid for applying said first sample of the modulation component to the suppressor grid in phase with the corresponding modulation component in the signal input so as to modify a bias potential which may be connected to the suppressor grid, (d) the signal output circuit comprises an output signal load connected to the anode of the electron tube, (e) the means for detecting said second sample comprises half wave modulation component detection means connected to output load and adapted to allow said second sample of the modulation component of the output signal to traverse therethrough, (f) means are connected to said second detection means for applying a portion of said second sample of the modulation component of the output signal of amplitude substantially equal in effect to the sample of the modulation component of the input signal within the subtracting means, in the absence of distortion, to the control grid but effectively 180 degrees out of phase with said first sample which is applied to the suppressor grid, so as to modify a bias potential which may be connected to the control grid.

13. A circuit for reducing distortion within a single amplifier stage comprising:

(a) an electron tube having a cathode, anode, control grid, and suppressor grid, (b) a signal input circuit comprising an inductor connected between cathode and ground, and a first and second conductor connected to the cathode and ground respectively, (c) a half wave detecting circuit comprising a direct current blocking capacitor with one end connected to the cathode, a first resistor connected between the other end of the capacitor and ground, a diode having its cathode connected to the junction between the resistor and the capacitor, a second resistor having one end connected to the anode of the diode, a bypass capacitor of such value as to bypass higher frequencies than the modulation component of an input signal which may be traversing the signal input circuit, connected between the other end of the second resistor and ground, (d) a first transformer comprising a primary and secondary winding having its primary winding connected between ground and the junction of the second resistor and second capacitor, (e) the secondary of the first transformer being connected between one of said grids of the electron tube and a source of negative bias therefor or an equivalent ground, and a third capacitor of such value as to bypass to ground frequencies higher than the modulation component of an input signal which may be traversing the signal input circuit, connected between said one of said grids and ground, (f) a signal load connected to the anode of the tube, (g) a second detection circuit comprising a fourth capacitor having one end connected to the anode, a third resistor connected between the other end of the fourth capacitor and ground, a second diode having its anode connected between the junction of the fourth capacitor and third resistor, a fourth resistor having one end connected to the cathode of the diode, a fifth capacitor connected between the other end of the fourth resistor and ground, (h) a second transformer comprising a primary and secondary winding having its primary winding connected between the junction of the fourth resistor and fifth capacitor, and ground, a first variably tapped resistor having its ends connected respectively to the ends of the secondary winding of the second transformer, (i) a source of bias for the other of said grids connected between one end of the secondary of the second transformer and ground, the tap of the variably tapped resistor being connected to the other of said grids, and a sixth capacitor connected between the other of said grids and ground;

(j) the polarity of the transformer windings being such that the signal applied to the other of said grids is 180 degrees out of phase with the signal applied to said one of said grids; the tap of the variably tapped resistor being adjusted so that the signal applied to the other of said grids is substantially equal in effect but opposite in phase to the signal applied to said one of said grids in the absence of distortion, so that any difference between the effective signals modulates the charge-carriers traversing the tube in such manner as to decrease said difference.

14. A circuit for reducing distortion as defined in claim 5 wherein the signal applied to the signal input circuit is an amplitude modulated carrier signal, and the first and second detecting means are each means for detecting said samples of the modulation components of the carrier signals in the signal input and signal output circuits respectively.

15. A circuit for reducing distortion as defined in claim 12 wherein the signal applied to the signal input circuit is an amplitude modulated carrier signal, and the first and second detecting means are each means for detecting said samples of the modulation components of the carrier signals in the signal input and signal output circuits respectively.

16. A circuit as defined in claim 13 wherein said one of said grids of the electron tube comprises the suppressor grid, and the other of said grids of the electron tube comprises the control grid.

No references cited.

ROY LAKE, *Primary Examiner.*

E. C. FOLSOM, *Assistant Examiner.*